US008436371B2

(12) United States Patent
Medendorp, Jr. et al.

(10) Patent No.: US 8,436,371 B2
(45) Date of Patent: May 7, 2013

(54) MICROSCALE OPTOELECTRONIC DEVICE PACKAGES

(75) Inventors: Nicholas W. Medendorp, Jr., Raleigh, NC (US); James Ibbetson, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 384 days.

(21) Appl. No.: 11/753,483

(22) Filed: May 24, 2007

(65) Prior Publication Data
US 2008/0290353 A1    Nov. 27, 2008

(51) Int. Cl.
*H01L 29/02*    (2006.01)
(52) U.S. Cl.
USPC ................. 257/88; 257/89; 257/99; 257/100; 257/173; 257/355; 257/E33.001; 257/E21.001; 438/23
(58) Field of Classification Search ............ 257/E33.056
See application file for complete search history.

(56) References Cited

U.S. PATENT DOCUMENTS

| | | | | |
|---|---|---|---|---|
| 5,516,727 | A | * | 5/1996 | Broom ............................. 438/26 |
| 6,577,073 | B2 | | 6/2003 | Shimizu et al. |
| 6,593,597 | B2 | | 7/2003 | Sheu |
| 6,617,795 | B2 | * | 9/2003 | Bruning ........................ 315/151 |
| 6,812,498 | B1 | | 11/2004 | Moon |
| 7,064,353 | B2 | | 6/2006 | Bhat |
| 7,322,718 | B2 | | 1/2008 | Setomoto et al. |
| 2001/0000924 | A1 | * | 5/2001 | Karnezos et al. .............. 257/666 |
| 2001/0030606 | A1 | * | 10/2001 | Jaffe et al. .................. 340/545.6 |
| 2002/0004251 | A1 | | 1/2002 | Roberts et al. |
| 2002/0094196 | A1 | * | 7/2002 | Schwartz ........................ 392/389 |
| 2003/0199783 | A1 | * | 10/2003 | Bloom et al. .................. 600/549 |
| 2004/0041222 | A1 | * | 3/2004 | Loh ................................ 257/433 |
| 2004/0080938 | A1 | * | 4/2004 | Holman et al. ................ 362/231 |
| 2004/0188593 | A1 | * | 9/2004 | Mullins et al. ................ 250/205 |
| 2004/0233655 | A1 | * | 11/2004 | Zimmerman et al. .......... 362/19 |
| 2005/0012109 | A1 | * | 1/2005 | Kohno et al. .................. 257/103 |

(Continued)

FOREIGN PATENT DOCUMENTS

| JP | 2000-214803 A | 8/2000 |
|---|---|---|
| JP | 2000-231363 A | 8/2000 |

(Continued)

OTHER PUBLICATIONS

Brukilacchio, Thomas, et al, "Beyond the limitations of todays LED packages: optimizing high brightness LED performance by a comprehensive systems . . . ", "Proceedings of SPIE", Jun. 2004, pp. 161-172, vol. 5366.

(Continued)

*Primary Examiner* — Fei Fei Yeung Lopez
(74) *Attorney, Agent, or Firm* — Vincent K. Gustafson; Jenkins, Wilson, Taylor & Hunt, P.A.

(57) ABSTRACT

An optoelectronic device article comprises a substrate containing at least one electrically conductive microvia, at least one emitter diode and at least one ESD diode, optionally formed in situ, disposed in or on the substrate, and an electrically conductive path between the foregoing elements. A reflector cavity may be defined in the substrate for receiving the emitter diode(s), with retention elements on the substrate used to retain a lens material. High flux density and high emitter diode spatial density may be attained. Thermal sensors, radiation sensors, and integral heat spreaders comprising one or more protruding fins may be integrated into the article.

72 Claims, 6 Drawing Sheets

U.S. PATENT DOCUMENTS

| | | |
|---|---|---|
| 2005/0068776 A1 | 3/2005 | Ge |
| 2005/0121686 A1* | 6/2005 | Keller et al. ............... 257/99 |
| 2005/0167682 A1* | 8/2005 | Fukasawa ................. 257/79 |
| 2005/0244098 A1* | 11/2005 | Barrett ..................... 385/17 |
| 2005/0265024 A1 | 12/2005 | Luk |
| 2006/0012299 A1* | 1/2006 | Suehiro et al. ............. 313/512 |
| 2006/0149607 A1 | 7/2006 | Sayers et al. |
| 2006/0188797 A1* | 8/2006 | Roy et al. ................. 430/30 |
| 2006/0198162 A1* | 9/2006 | Ishidu et al. ............... 362/623 |
| 2006/0220036 A1* | 10/2006 | Lee et al. .................. 257/81 |
| 2007/0040502 A1* | 2/2007 | Setlur et al. ............... 313/512 |
| 2007/0080360 A1* | 4/2007 | Mirsky et al. ............. 257/99 |
| 2007/0132959 A1* | 6/2007 | Shanley et al. ............ 353/31 |
| 2007/0194343 A1* | 8/2007 | Jang et al. ................. 257/103 |
| 2007/0247852 A1 | 10/2007 | Wang |
| 2007/0253209 A1 | 11/2007 | Loh et al. |
| 2007/0257272 A1 | 11/2007 | Hutchins |
| 2008/0006837 A1* | 1/2008 | Park et al. ................. 257/98 |
| 2008/0017876 A1* | 1/2008 | Lin .......................... 257/98 |
| 2008/0019124 A1 | 1/2008 | Smith et al. |
| 2009/0212709 A1 | 8/2009 | Meijer et al. |

FOREIGN PATENT DOCUMENTS

| | | |
|---|---|---|
| JP | 2001-156341 A | 6/2001 |
| JP | 2007-200577 A | 8/2007 |
| KR | 200070006073 A | 1/2007 |
| WO | 2007061758 A1 | 5/2007 |

OTHER PUBLICATIONS

LIGHTime Staff Writer, "Hymite develops silicon-based packaging solution for HB-LEDs", "http://www.sslighting.net/documents/view/cldoc.php?id=7960#top", Feb. 26, 2007.

Dawson, Martin D., "Semiconductor optoelectronics at the Institute of Photonics: materials and devices (Presentation)", 2004, 29 Slides, Publisher: The Institute of Photonics.

Hymite GMBH, "Wafer level packaging solution for HB LED applications", "HyLED (TM) Generic LED Package: Preliminary Specification", Dec. 14, 2005.

"Hymite A/S announces innovative silicon-based packaging solution: HyLED", "http://www.led-professional.com/content/view/552/56/", Feb. 26, 2007.

\* cited by examiner

MICROSCALE OPTOELECTRONIC DEVICE PACKAGES

FIELD OF THE INVENTION

The present invention relates to optoelectronic devices including light emitting diodes and/or laser diodes, and to systems employing the same.

BACKGROUND OF THE INVENTION

Optoelectronic devices such as light emitting diodes (LEDs) and laser diodes have numerous applications and are growing in popularity. LEDs—including those outputting white and other colors of light—are used, for example, for general and automotive illumination, for backlights in liquid crystal and other displays, for high color rendering index devices, and for color mixing devices. Laser diodes are used, for example, in various communication applications, including transmitters for optical fiber communications systems and single-mode pump diodes for fiber amplifiers. LEDs and laser diodes are solid state devices each having a P-N junction semiconductor diode that emits radiation (e.g., infrared radiation, visible radiation, ultraviolet radiation, and so on) responsive to application of electrical current.

In the illumination context, usage of LEDs is increasing relative to incandescent and other lighting technologies because LEDs generally have longer service life, better efficiency in converting electrical energy into radiation energy in the visible spectral range, and lower thermal emission characteristics. LED lamps are considerably more robust than other conventional (e.g., incandescent, halogen, fluorescent, or high intensity discharge) lamps because they lack filaments and do not require fragile glass exterior casings. Instead, a LED lamp is typically disposed in or under a covering of an encapsulant material and optional lens (which may be integrated with the encapsulant), with such encapsulant and optional lens typically being fabricated of durable polymeric materials. Further advantages of LEDs are that they have rapid turn-on time and generate less heat per lumen of light output relative to traditional lighting products.

There are currently three methods for producing LEDs that emit white light. The first and second methods use a single blue, violet or UV LED die that emits a single wavelength of radiation. The first method utilizes a phosphoric coating deposited on the LED die, with the phosphor serving to convert portions of the light into longer wavelengths that lead to the perception of white light. The second method also uses a phosphor for the same purpose, but in the form of a phosphoric layer disposed well above the LED die—e.g., on the outer surface of an encapsulant, or between an encapsulant and lens of a LED package. The third method eliminates the need for phosphors; instead, it employs independent red, blue, and green dies in the same package that emits light perceived as white in color when all three dies are powered.

Numerous applications for LEDs and laser diodes would benefit from greater flux density; however, various considerations thermal and packaging constraints have limited the ability flux density output of conventional optoelectronic devices. It would be desirable to achieve greater flux density from an optoelectronic device without causing such device to overheat. It would be even more desirable if such result could be obtained with an electrically isolated thermal path, to ensure smooth device operation at high current and/or high temperature operating states. It would be further desirable to attain high flux density without making the resulting device more susceptible to electrostatic discharge or voltage aberrations.

With regard to device packaging, it would be desirable to reduce the spatial footprint of structure required to support the emitting region of an LED—particularly in the context of multi-LED devices. For example, the closer that independent LED dies (e.g., red, blue, and green dies) are placed in proximity to one another in a multi-LED device, the more closely that the resulting combination of dies approximates a point source, thus enhancing the perception of color mixing and concomitantly reducing a viewer's ability to perceive discrete color emissions from adjacent dies emitting distinct wavelengths. Packaging and thermal constraints, however, currently limit the ability for multiple LEDs to operate at high flux densities while being disposed very close together.

Conventional optoelectronic device packages require numerous components and component assembly steps. To promote efficiency and minimize the potential for part mishandling and/or fabrication errors, it would be desirable to minimize the number of discrete components and assembly steps required to fabricate functional optoelectronic device packages.

LEDs, especially gallium nitride-based LEDs, are particularly susceptible to damage to electrostatic discharge or other application of a reverse bias voltage to the anode and cathode. To prevent damage to a LED due to electrostatic discharge, a secondary electrostatic discharge (ESD) diode operating in the breakdown region (i.e., in a conductive state) is typically connected in parallel with the LED. A normal forward bias voltage applied to the terminals of the LED flows through the P-N junction of such LED and generates light. When an abnormal reverse voltage appears or there is an electrostatic discharge, excess voltage is discharged through the secondary ESD diode operating in the breakdown mode. Since the discharge path goes through the secondary diode rather than the LED, the LED will not be damaged due to electrostatic discharge or abnormal voltage. Although such parallel ESD diode protection system is capable of minimizing damage to the LED, the addition of ESD protection makes manufacture of a LED package more difficult and costly, and undesirably increases the footprint of a LED package. It would be desirable to provide ESD protection in an optoelectronic device package while minimizing these concerns.

Following assembly, optoelectronic packages, such as LED packages, are typically performance tested and "binned" (i.e., sorted) according to ranges of dominant wavelength and brightness. Such binning permits intensity and/or color matching between various packages to be used in a particular product or product line. Testing and binning can consume substantial resources of labor and or equipment. It would be desirable to permit numerous optoelectronic device packages to the tested and binned simultaneously.

Accordingly, there is a continuing need in the art for improved optoelectronic device packages and methods for making the same.

SUMMARY OF THE INVENTION

The present invention relates to microscale optoelectronic device articles and packages addressing various needs in the art. Preferred embodiments include microscale optoelectronic device articles with functional components formed in or on common substrates, with integrated electrostatic discharge protection components, and electrically conductive microvias. In further embodiments, optional encapsulant and/ or lens materials may be deposited over substrates having structures adapted to retain such materials.

In one aspect, the invention relates to a LED article comprising: a substrate containing at least one electrically conductive microvia; at least one emitter diode adapted to emit radiation and disposed in or on the substrate; at least one ESD diode disposed in or on the substrate; and a first electrically conductive path between the at least one LED die and the at least one microvia, the path being in electrical communication with the at least one ESD diode.

In a further aspect, the invention relates to an optoelectronic device article comprising: a substrate containing at least one electrically conductive microvia; at least one emitter diode adapted to emit radiation and disposed in or on the substrate; at least one ESD diode disposed in or on the substrate; and a first electrically conductive path between the at least one emitter diode and the at least one microvia, the path being in electrical communication with the at least one ESD diode; wherein the optoelectronic device article has a flux density of preferably at least about 250 mW/mm$^2$ per electrical watt input as measured at, or just above, the upper surface of the optoelectronic device article.

A further aspect of the invention relates to an optoelectronic device article comprising: a substrate containing a plurality of electrically conductive microvias; a plurality of emitter diodes adapted to emit radiation and disposed in or on the substrate; at least one ESD diode disposed in or on the substrate; and for each emitter diode of the plurality of emitter diodes, a first electrically conductive path between the emitter diode and a microvia of the plurality of microvias, the path being in electrical communication with the at least one ESD diode; wherein the plurality of emitter diodes is arranged with a spatial density of at least about 20 mm$^2$ of emitter diodes per cm$^2$.

Another aspect of the invention relates to an optoelectronic device article comprising: a substrate containing at least one electrically conductive microvia; at least one emitter diode adapted to emit radiation and disposed in or on the substrate; at least one ESD diode disposed in or on the substrate; a first electrically conductive path between the at least one emitter diode and the at least one microvia, the path being in electrical communication with the at least one ESD diode; and an electrically isolated thermal contact pad in thermal communication with the at least one emitter diode.

Yet another aspect of the invention relates to an optoelectronic device article comprising: a substrate containing at least one electrically conductive microvia; at least one emitter diode adapted to emit radiation and disposed in or on the substrate; at least one ESD diode disposed in or on the substrate; a first electrically conductive path between the at least one emitter diode and the at least one microvia, the path being in electrical communication with the at least one ESD diode; and at least one thermal sensing element in thermal communication with the at least one emitter diode.

A further aspect of the invention relates to an optoelectronic device article comprising: a substrate containing at least one electrically conductive microvia; at least one emitter diode adapted to emit radiation and disposed in or on the substrate; at least one ESD diode disposed in or on the substrate; a first electrically conductive path between the at least one emitter diode and the at least one microvia, the path being in electrical communication with the at least one ESD diode; and at least one radiation sensing element adapted to provide a radiation sensing element output signal to any of (1) the at least one emitter diode and (2) a control element associated with the at least one emitter diode.

A still further aspect of the invention relates to a method comprising: forming a retention element in or on a substrate, said retention element being adapted to retain any of an encapsulant and a lens; providing an emitter diode in or on the substrate; providing an ESD diode in or on such substrate; defining a microvia through the substrate; and forming an electrically conductive path between the emitter diode and the microvia, the path being in electrical communication with the at least one ESD diode.

Yet another aspect of the invention relates to a method comprising: providing a plurality of emitter diodes in or on a substrate; providing a plurality of ESD diodes in or on the substrate; defining a plurality of microvias through the substrate; for each emitter diode of the plurality of emitter diodes, forming an electrically conductive path between the emitter diode and a microvia, the path being in electrical communication with at least one ESD diode of the plurality of ESD diodes; and testing at least one output characteristic of at least two emitter diodes or at least two groups of emitter diodes of the plurality of emitter diodes while the plurality of emitter diodes is disposed in or on the substrate.

In another aspect of the invention, any of the foregoing aspects may be combined for additional advantage.

Other aspects, features and embodiments of the invention will be more fully apparent from the ensuing disclosure, drawings, and appended claims.

BRIEF DESCRIPTION OF THE DRAWINGS

In the Figures, like element numbers between Figures are intended to refer to elements with similar structure or functionality.

DETAILED DESCRIPTION OF THE INVENTION, AND PREFERRED EMBODIMENTS THEREOF

The present invention relates to microscale optoelectronic device articles and packages including one or more emitter diodes, such as one or more LEDs or laser diodes, formed on a substrate. A multiplicity of emitter diodes, preferably of millimeter width or smaller, may be disposed in close proximity to one another on a common substrate. Each emitter diode preferably has at least one associated ESD diode formed in or on the substrate to protect the emitter diode from electrostatic discharge or voltage aberrations. Preferably, each emitter diode is in electrical communication with an associated ESD diode with an electrically conductive path including a conductive microvia that may be formed in a thinned membrane portion of the substrate. A microvia comprises a narrow pathway formed through the thinned portion of the substrate that is filled with a conductive material in order to provide an electrical connection between the top and bottom surface of the thinned portion of the substrate while providing a mechanical barrier between the top and bottom surface. The size and shape of the microvia may vary depending on the application and the method of forming the same; in particular, a microvia may be substantially longer in one lateral dimension than another. The sidewalls of a microvia may be substantially vertical (perpendicular to the substrate surface) in the case of using an anisotropic etch through the substrate, or slanted in the case of using a crystallographic etch, or curved in the case of an isotropic etch. A preferred microvia comprises a conductive material, such as (but not limited to) gold, and has a lateral dimension at its narrowest point of preferably less than or equal to about 50 μm, more preferably less than or equal to about 20 μm, and more preferably still less than or equal to about 10 μm.

In a preferred embodiment, a cavity is formed in substrate and is bounded along a surface thereof by a thinned membrane portion of the substrate. An optically reflective material, such as aluminum, may be deposited or otherwise coated on the walls of the cavity to form a reflector to redirect emissions from an emitter diode. If provided, a reflector cavity preferably includes at least one emitter diode is disposed substantially within the reflector cavity. While it is preferable that the emitter diode be sized and positioned to fit fully within the reflector cavity, the phrase "substantially within the reflector cavity" refers to the possibility that the height of the emitter diode may be slightly taller than the depth of the reflector cavity in certain embodiments.

Substrates of any suitable material type may be used in connection with embodiments of the present invention. Silicon, silicon carbide, and aluminum nitride, whether doped or undoped, represent non-limiting examples of substrate materials that may be used. In certain embodiments, substrate may be composed of layers of different materials. For example, a substrate may include one or more P-type layers and one or more N-type layers. The differential etching characteristics of these materials (or other materials with differential etching characteristics) may be utilized to form etch stops in desired locations of a substrate. Insulating materials, such as oxides or nitrides, may be used to form one or more layers or regions of a substrate. Similarly, one or more regions or layers of a substrate may comprise semi-insulating or conductive materials, as necessary or desirable for a specific optoelectronic device article.

In a preferred embodiment, functional structures such as emitter diodes and/or ESD diodes are formed in situ in or on a substrate. Conductors, insulators, and other materials and structures may be further formed in situ in or on a substrate. Alternatively, any of the foregoing items may be pre-formed, and then placed in or on a substrate by any conventional attachment or bonding method, such as by use of a die attach pad formed on the substrate. Functional structures may be formed of any suitable material type. Diodes in particular may comprise silicon carbide and/or III-V nitride materials to enable high power operation.

ESD diodes may be at least partially embedded in a substrate according to the present invention. Such embedding may include implantation, such as shallow n+ implantation.

In one embodiment, an ESD diode is disposed in or on the substrate adjacent to a front surface of the substrate along which radiation is transmitted outward from an emitter diode. In another embodiment, an ESD diode is disposed in or on a lower surface of the substrate. An embedded ESD diode may be provided in contact with (e.g., partially covered with) a conductive material such as a metal trace or pad. While only one ESD diode may be associated with each emitter diode, in preferred embodiments each emitter diode has two associated ESD diodes.

Various processes known in the semiconductor, optoelectronic device, or printed circuit fabrication arts may be utilized to process substrates or form structures therein or thereon. Additive processes, such as chemical vapor deposition (CVD), metalorganic chemical vapor deposition (MOCVD), epitaxial growth, liquid phase epitaxy (LPE), vapor phase epitaxy (VPE), pulsed laser deposition, sputtering, ion implantation, and the like may be used to effect addition of material to a substrate. Subtractive processes, including machining and/or surface or bulk micromachining processes such as etching, laser ablation, micro hole drilling, electrostatic discharge machining, and the like may be used to effectuate removal of material (e.g., from a substrate or material deposited thereon). Conventional patterning techniques, including photolithography and microlithography, may be used in conjunction with such additive or subtractive processes to confine the action of additive or subtractive processes to desired locations.

As indicated previously, one or more portions of a substrate may be selectively removed or thinned to form one or more membrane portions, such as may bound one extremity of a cavity formed in the substrate. In certain embodiments, a membrane portion may have a thickness of less than or equal to about 20 μm. One or more microvias may be formed in such a membrane region. A microvia may be formed laterally adjacent to an emitter diode in a reflector cavity. Alternatively, since the presence of a microvia may detrimentally impact the structural integrity of a reflector cavity, a microvia may be formed in a membrane portion bounding a cavity that is non-adjacent to the emitter diode, with appropriate (e.g., metal-containing) electrical pathways provided—e.g., along the front surface or backside of the substrate, or as intermediate substrate layers.

Emitter diodes of the present invention may include diodes of any standard configuration, including flip-chips. In certain embodiments, a wirebond is made from an upper surface of an emitter diode to an adjacent contact pad to establish electrical flow through such diode to a bottom surface thereof. Any conventional wirebond fabrication method, including thermal soldering and laser soldering, may be used. By fabricating various functional components in situ in or on the substrate, however, embodiments of the present invention are intended to minimize pick-and-place fabrication that is commonly employed in forming conventional optoelectronic device packages.

A potential problem associated with fabrication of optoelectronic devices in microscale is that it may be difficult to form and/or adhere lenses or similar materials over an emitter diode, whether due to alignment difficulties and/or limited surface area for adhesion. To mitigate such difficulties, substrates according various embodiments of the present invention include integrated retention elements adapted to anchor or otherwise retain encapsulant and/or lens materials. In one embodiment, a retention element comprises a cavity. Such a retention cavity may be coextensive with a reflector cavity; alternatively, a retention cavity may not provide reflector utility. In another embodiment, a retention element comprises at least one raised feature such as a pylon, post, or the like, protruding from the substrate. Such a raised feature may be formed, for example, by selectively etching or otherwise removing bulk material to define the raised feature. In another embodiment, a retention element comprises a roughened surface of the substrate. Such roughened surface is preferably characterized by an increased surface area relative to a smooth surface. The surface may be roughened by selective etching, abrasion, milling, chemical treatment, or other suitable techniques, and the resulting roughness may be regular or irregular in character as to depressions and/or protrusions in the surface.

Material serving as an encapsulant and/or lens may be deposited over an emitter diode using any suitable means. Spin deposition may be advantageously employed for such deposition; however, any of liquid jetting, electrophoretic deposition, screen printing, and adhesion methods may be used.

An optional phosphor material layer may be deposited on or over an emitter diode. Such phosphor material may be used to down-convert portions of emitted light into longer wavelengths to lead to the perception of white light. In one embodiment, a phosphor material layer is deposited on an emitter diode. In another embodiment, a phosphor material is deposited well above a surface of an emitter diode, such as on the outer surface of an encapsulant or lens intermediately disposed between the emitter diode and the phosphor. Spin deposition may be advantageously employed for such phosphor deposition; however, liquid jetting, electrophoretic deposition, screen printing, and/or adhesion methods may be used. In one embodiment, a phosphor coating may be applied to an emitter diode prior to placement of the emitter diode in a reflector cavity.

One advantage of forming optoelectronic device articles in microscale using processes common to the semiconductor and/or circuit fabrication arts is that various driver and/or control circuits or circuit elements may be formed on the same substrate as at least one emitter diode. For example, an electrical driver circuit or elements thereof may be formed on a substrate substantially simultaneously with the formation of other package elements. In another example, one or more circuits or circuit elements corresponding to a sensor may be formed on a substrate with other package elements. Integral formation of circuit elements promotes efficient manufacture and advantageously permits testing and binning of an emitting device together with such circuit elements. In one embodiment, a plurality of emitter diodes provided on a common substrate are tested as to at least one output characteristic, such as any of intensity, color, wavelength, and frequency.

A further advantage of forming optoelectronic device articles in microscale is that high flux densities may be achieved. Flux density is a measure of the amount of optical energy passing through a given area per unit time. For a localized source such as one or more LEDs, flux density is dependent on the location where it is measured and the input electrical power. In various embodiments, an optoelectronic device article has an average flux density of preferably at least about 250 mW/mm$^2$ per watt of input power; more preferably at least about 500 mW/mm$^2$ per watt of input power; and more preferably still at least about 800 mW/mm$^2$ per watt of input power; with each of the preceding flux density values measured at the surface of the reflector cavity. Such densities are desirably achieved in combination with ESD protection, due to the integration of one or more ESD diodes in or on the same substrate as emitter diodes in embodiments of the present invention.

One factor contributing to enhancement of flux density is an increase in emitting surface area relative to total surface area of the device article, due to reduction in the amount of non-emitting area disposed between emitters. One measure of spacing between emitter diodes is linear spacing. In various embodiments, an optoelectronic device article includes a plurality of emitter diodes, with each emitter diode having a center-to-center spacing of no more than 110% of the linear dimension of each emitter diode. For example, for 1 mm×1 mm emitter diodes, the optoelectronic device article includes a plurality of diodes with each emitter diode having a center-to-center spacing of no more than 1.1 mm. In the case of rectangular emitter diodes, where the aspect ratio of the diode length to width is greater than unity, each emitter diode may have a center-to-center spacing of no more than 110% of the diode width.

Another measure of spacing between emitter diodes includes spatial density of the emitting diodes, as defined by the ratio of the emitting area relative to the smallest area that contains the emitting diodes. In various embodiments, an optoelectronic device article includes a plurality of emitter diodes—preferably at least four emitter diodes—arranged with a spatial density of preferably at least about 20 mm$^2$ of emitter diodes per cm$^2$; more preferably at least about 60 mm$^2$ of emitter diodes per cm$^2$; and more preferably still at least about 80 mm$^2$ of emitter diodes per cm$^2$.

In various embodiments, a reflector cavity may have a depth of less than about 250 microns and a width dimension of preferably less than about two millimeters, and more preferably a width of less than about 1.2 millimeters. Preferably, an emitter diode disposed within such a cavity may have a width dimension of less than about 1.0 millimeter, a thickness of less than about 225 microns. Such emitter diode preferably has a top surface area of less than or equal to about 1.0 mm$^2$. In one embodiment, an optoelectronic device package including at least one integrated ESD diode preferably has a total width of less than about 2 millimeters. In one embodiment with multiple emitter diodes disposed on a common substrate or in a common reflector cavity, four or more diodes may be arranged within the cavity with a spatial density of at least about 80 mm$^2$ of diodes per cm$^2$.

According to the present invention, a large number of emitter diodes (e.g. LED dies) may be disposed on a single substrate. In various embodiments, an optoelectronic device article includes a substrate with preferably at least one hundred emitter diodes; more preferably at least one thousand emitter diodes; and more preferably still at least ten thousand emitter diodes.

As indicated previously, a plurality of emitter diodes disposed on a common substrate may be tested as to any of various performance or output characteristics. Following such testing, the substrate may be diced or otherwise separated into a plurality of portions each preferably having at least one emitter diode and at least one associated ESD diode. If the substrate is composed of dissimilar material layers, such as an N-type layer and a P-type layer, then dicing of the substrate may damage the junction therebetween. To mitigate this problem, one embodiment includes the formation in the substrate of one or more "sinker" implants (e.g., a N++ type sinker implant) penetrating the junction between dissimilar substrate layers, along the intended cutting path between substrate portions. The presence of such a sinker implant along junction between dissimilar substrate layers isolates such junction from dicing damage.

As indicated previously, various embodiments of the present invention contemplate the presence of a large number of emitter diodes in or on a common substrate. In preferred embodiments, each emitter diode is independently controlled. Each diode of a plurality of diodes provided on a common substrate may be adapted to emit the same color, or to emit different colors relative to one another. In one embodiment, one or more emitter diode combinations including at least one red LED, at least one (but more preferably at least two) green LEDs, and at least one blue LED are clustered in close proximity to approximate a point source. Each diode of such a cluster may be controlled independently, or such cluster may be controlled as a group. A plurality of emitter diodes may be disposed in a common reflector cavity. Such plurality may include, for example, at least two white light LEDs, or a combination of red, green, and blue LEDs in any suitable number.

Thermal management is important to achieving reliable operation of an emitting an optimal electronic device article, particularly when operated at high current levels. Electrical resistance is proportional to temperature in most conductors. In preferred embodiments, an emitter diode is disposed in thermal communication with an electrically isolated thermal contact pad. Such configuration avoids erratic or non-linear output that may otherwise result from significant heating of the current flow path by the emitter diode during device operation. Such an electrically isolated thermal contact pad is enabled through the use of microvias and conductors that are spatially separated from the thermal contact pad directly below the emitter diode. A heat dissipating structure or associated thermal conduit is preferably disposed in thermal communication with the thermal contact pad.

In preferred embodiments, an optoelectronic device article has a thermal resistance of less than about 3 K/W between the at least one LED die and a heat dissipating structure.

In a preferred embodiment, one or more thermal sensing elements may be provided in thermal communication with an emitter diode. A preferred type of thermal sensing element includes a thin-film resistor, which may be fabricated in situ within the optoelectronic device article. Such a thermal sensing element may be disposed within the thermal contact pad below an emitter diode, or in any other desirable location in thermal contact with the emitter diode. Preferably, a control element desirably formed in or on the substrate receives an output signal from the thermal sensing element, and controls voltage and/or current supplied to the emitter diode responsive to the output signal. Such control may include reducing voltage and/or current to the emitter diode, or even switching off power to the emitter diode, in response to an output signal indicating that the emitter diode has reached an undesirably high temperature.

In one embodiment, at least one radiation sensing element is provided in electrical communication with any of an emitter diode and a control element associated with the emitter diode. Such a radiation sensing elements may comprise a photodiode. The associated control element may be adapted to control voltage and/or current supplied to an emitter diode responsive to an output signal of the radiation sensing element. In one embodiment, the radiation sensing element may be adapted to sense motion of a body in proximity to an optoelectronic device article. In this regard, the radiation sensing element may be used to automatically activate an emitter diode. A radiation sensing element may also be used to sense the presence and or intensity of ambient light, and thus used to automatically activate, modulate, or deactivate operation of an emitter diode. In another embodiment, a radiation sensing element is adapted to sense any of intensity, color, wavelength, and frequency output of at least one emitter diode (e.g., a LED die) or aggregated output of similar types from a plurality of emitter diodes, and to generate a signal used to responsively adjust the output of the at least one emitter diode. For example, such method may be used to address differential aging of LED dies used in the same product. Consistent with the foregoing embodiments, a radiation sensing element may be disposed: along a front surface of a substrate supporting at least one emitter diode; along a reflector cavity of such a substrate; suspended within a reflector cavity (e.g., formed on an inwardly-projecting wall section or cantilevered element protruding into a portion of the reflector cavity); or in any other location to sense radiation as appropriate to the desired end use.

Various advantages and features of the invention are further illustrated with reference to the Figures, which are not to be construed as limiting the scope of the invention but rather illustrate certain embodiments of the invention in specific application thereof.

Figure 1:
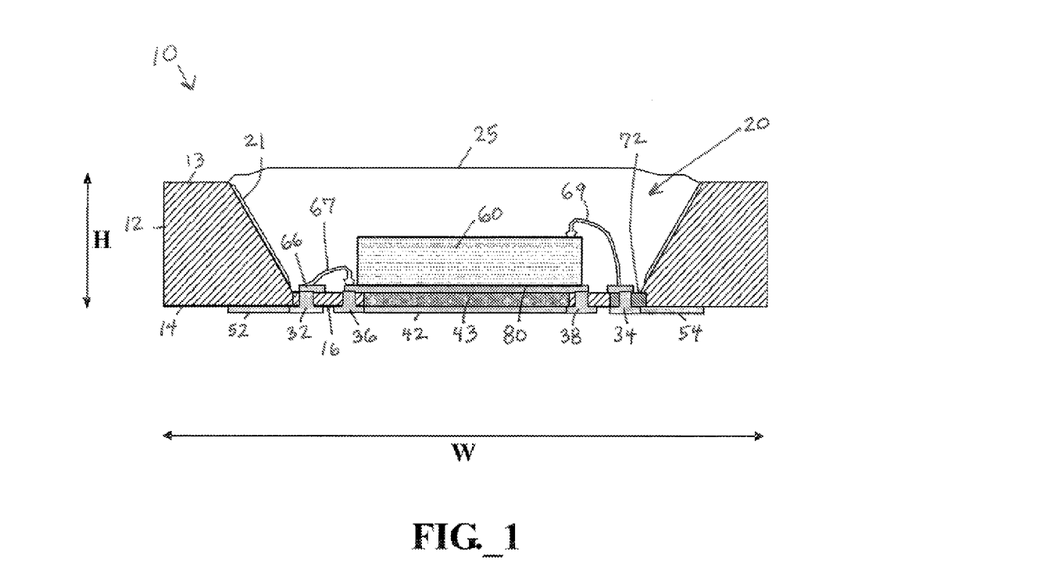
FIG. 1 is a cross-sectional schematic view of at least a portion of a microscale optoelectronic device package according to a first embodiment of the present invention, the package including an emitter diode disposed within a reflector cavity bounded in part by a membrane portion of a substrate, with the membrane portion defining a plurality of microvias and including an ESD diode.

FIG. 1 is a cross-sectional schematic view of at least a portion of a microscale optoelectronic device package 10 according to a first embodiment of the present invention, the package 10 including an emitter diode 60 disposed within a reflector cavity 20 bounded in part by a membrane portion 16 of a substrate 12. The membrane portion 16 defines a plurality of microvias 32, 34, 36, 38 and includes an ESD diode 72 disposed along the membrane portion 16. As illustrated, the microvias 32, 34, 36, 38 have substantially vertical sidewalls, such as may be formed with an anisotropic etch through the substrate 12; however, as indicated previously, such microvias may be formed of any convenient or desirable size or shape. The substrate 12 includes a front or upper surface 13 (along which radiation is transmitted outward from the emitter diode 60) and an opposing backside or lower surface 14. The reflector cavity 20 has a reflective material 21 (e.g., aluminum or other metal) deposited along the side walls thereof. An encapsulant and/or lens material 25, such as silicone, is deposited over the emitter diode 60 to substantially fill the reflector cavity 20.

As illustrated, the emitter diode 60 is disposed over a conductor layer 80 (which may optionally comprise a die attach pad), an intermediate layer 43, and a thermal contact pad 42. The intermediate layer 43 may comprise a thermal conductor, or optionally a thin-film resistor useful as a thermal sensing element. The thermal contact pad 42 is, by way of microvias 36, 38, in electrical communication with current flowing through the emitter diode 60; in this regard, the thermal contact pad 42 is not electrically isolated.

Two wirebonds 67, 69 each having an associated contact 66, 68 are provided in the package 10. The first wirebond contact 66 is in electrical communication with a backside trace 52 by way of a microvia 32, and is further in communication with the conductor layer 80 over which the emitter diode 60 is formed or otherwise affixed. The other wirebond 69 connects between a top side of the emitter diode 60 and a contact 68 that is in communication with a backside trace 54 by way of a microvia 34. The ESD diode 72 is formed along the membrane 16 over such microvia 34, although it may be placed in any suitable location so long as it provides a parallel path for current flow to the emitter diode between the wirebonds 67, 69.

The package 10 preferably has an overall height dimension (H) of less than or equal to about 250 microns, and a width dimension (W) of less than or equal to about 1800 microns.

Figure 2:
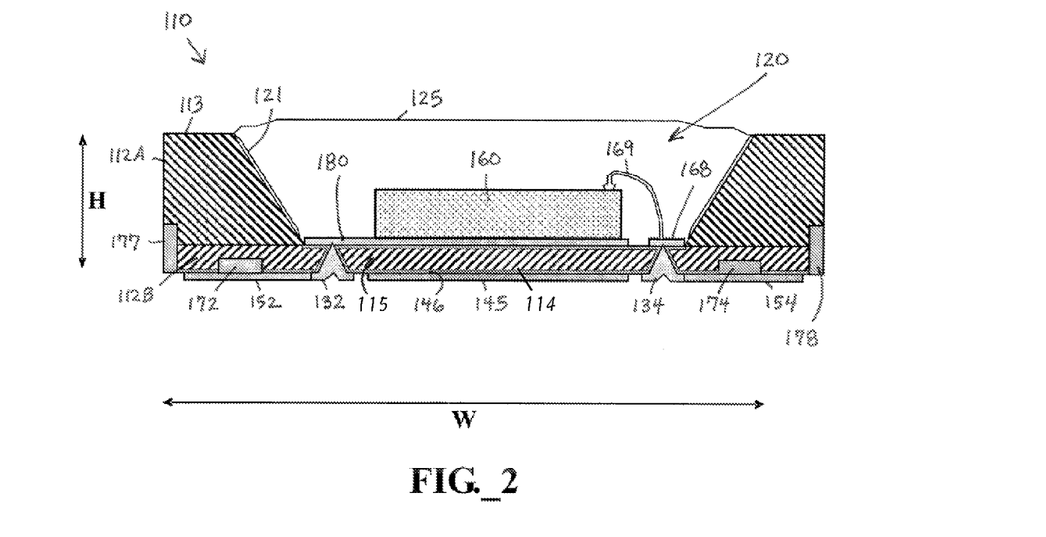
FIG. 2 is a cross-sectional schematic view of at least a portion of a microscale optoelectronic device package according to a second embodiment, the package including ESD diodes disposed along a backside surface of a substrate, and an emitter diode disposed within a reflector cavity bounded in part by a membrane portion of a substrate, with the membrane portion defining a plurality of microvias disposed on either side of an electrically isolated thermal contact pad beneath the emitter diode.

FIG. 2 is a cross-sectional schematic view of at least a portion of a microscale optoelectronic device package 110 according to a second embodiment, the package 110 including ESD diodes 172, 174 disposed along a backside surface 114 of a substrate composed of substrate layers 112A, 112B, and an emitter diode 160 disposed within a reflector cavity 120 (having a deposited reflective material 121) bounded in part by a membrane portion 115 of the substrate. The substrate has a top or front surface 113. The membrane portion 115 defines a plurality of microvias 132, 134 disposed on either side of a thermal contact pad 145 beneath the emitter diode 160. Since the microvias 132, 134 are spatially separated from the thermal contact pad 145, the thermal contact pad 145 can be electrically isolated. In the case of a silicon substrate, electrical isolation is achieved by the formation or addition of an insulating surface layer 146 (e.g., silicon dioxide) that coats most or all of the substrate surface prior to the metallization of the microvias and contact pads. Since the insulating layer is very thin (i.e., preferably less than or equal to about 1 micron, more preferably less than or equal to about 0.1 micron), the impact on heat flow therethrough is small.

The upper substrate layer 112A is preferably formed of a readily etchable material, such as N-type silicon, whereas the lower substrate layer 112B is preferably formed of a less-etchable material, such as P-type silicon, to serve as an etch stop in formation of the reflector cavity 120. Such P-type silicon layer may be formed on the N-type layer by any suitable method, including epitaxial growth. Sinker implants (e.g., N++ type sinker implants) 177, 178 are formed along desirable cut lines to penetrate the junction between substrate layers 112A, 112B to isolate such junction from dicing damage if it is desired to cut the illustrated single emitting-diode-containing optoelectronic package 120 from a larger substrate.

The emitter diode 160 is disposed over a conductor layer 180 (which may optionally comprise a die attach pad), the membrane portion 115 (which in this instance is coextensive with the lower substrate layer 112B), and the thermal contact pad 145. The emitter diode 160 is protected against electrostatic discharge or voltage aberration by the ESD diodes 172, 174, which are in electrical communication with conductive traces 152, 154, respectively, that form an electrically conductive path through the device in conjunction with microvia 132, 134, contact 168, wirebond 169, and conductor layer 180. ESD diodes may be formed by implanting a N-type layer, for example, thus forming a N-P junction with the P-type (e.g., silicon) lower substrate layer 112B.

As illustrated, an encapsulant and/or lens material 125, such as silicone, is deposited over the emitter diode 160 to substantially fill the reflector cavity 120. In this instance, the reflector cavity 120 serves as a retaining element for such encapsulant and/or lens material 125. The package 110 preferably has an overall height dimension (H) of less than or equal to about 250 microns, and a width dimension (W) of less than or equal to about 1800 microns.

Figure 3:
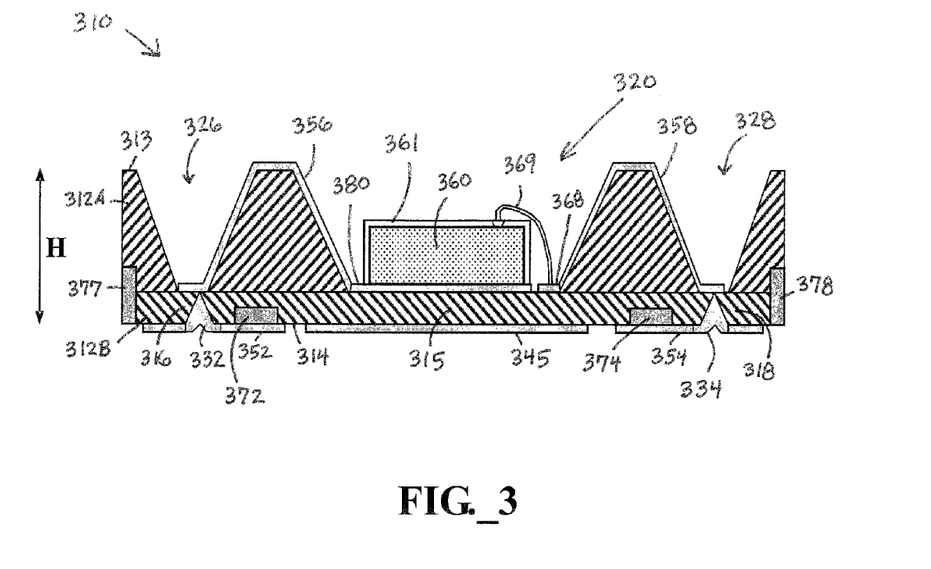
FIG. 3 is a cross-sectional schematic view of at least a portion of a microscale optoelectronic device package according to a third embodiment, the package including ESD diodes disposed along a backside of a substrate, and an emitting diode disposed within a reflector cavity bounded in part by a first membrane portion of a substrate, with the substrate defining additional cavities that are non-adjacent to the emitter diode and bounded by second membrane portions of the substrate that define microvias located remotely from the emitter diode.

Referring to FIG. 3, such figure provides a cross-sectional schematic view of at least a portion of a microscale optoelectronic device package 310 according to a third embodiment, the package 310 including ESD diodes 372, 374 disposed along a backside surface 314 of a substrate composed of substrate layers 312A, 312B. An emitter diode 360 having a phosphor layer 361 deposited thereon is disposed in a reflector cavity 320 bounded in part by a first membrane portion 315. The substrate further defines additional cavities 326, 328 that are non-adjacent to the emitter diode 360 and bounded by second membrane portions 316, 318 of the substrate that define microvias 332, 334 located remotely from the emitter diode 360. The upper substrate layer 312A is preferably formed of a readily etchable material, such as N-type silicon, whereas the lower substrate layer 312B is preferably formed of a less-etchable material, such as P-type silicon, to serve as an etch stop in formation of the cavities 320, 326, 328, such that the membrane portions 315, 316, 318 are coextensive with the second membrane portion 312B. Sinker implants (e.g., N++ type sinker implants) 377, 378 are formed along desirable cut lines to penetrate the junction between substrate layers 312A, 312B The emitter diode 360 is disposed over a conductor layer 380 (which may optionally comprise a die attach pad), the membrane portion 315, and an electrically isolated thermal contact pad 345 (for clarity in this and the ensuing Figures, no insulating layer is shown, but it is to be understood that an insulating layer, such as the layer 146 illustrated in FIG. 2, would be provided in regions where electrical insulation is desired). The emitter diode 360 is protected against electrostatic discharge or voltage aberration by the ESD diodes 372, 374, which are in electrical communication with conductive traces 352, 354, respectively, that contact a conductive path through the emitter diode 360 including the microvias 332, 334, traces 356, 358, conductor layer 380, wirebond 369, and contact 368. The traces 356, 358 are disposed up the walls of the cavities 326, 328, along the front surface 313 of the substrate, and down the walls of the reflector cavity 320. The walls of the reflector cavity 320 may further include reflective material deposited thereon adjacent to the traces 356, 358. The resulting package 310 preferably has an overall height dimension (H) of less than or equal to about 250 microns. It is to be understood that the size of the cavities 326, 328 may be substantially smaller than the emitter cavity 320, and/or have a substantially different shape, in order to minimize the overall size of the device 310.

Figure 4A:
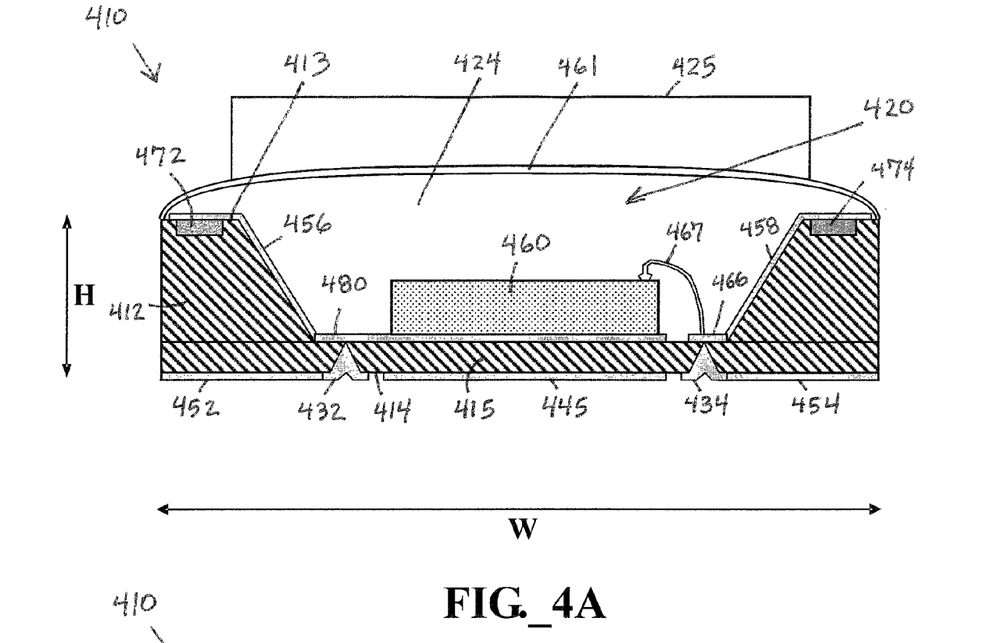
FIG. 4A is a cross-sectional schematic view of at least a portion of a microscale optoelectronic device package according to a fourth embodiment, the package including ESD diodes disposed along a front surface of a substrate, and an emitter diode disposed within a reflector cavity bounded in part by a membrane portion of the substrate, the package further including an encapsulant and lens disposed over the reflector and emitter diode.

FIG. 4A is a cross-sectional schematic view of at least a portion of a microscale optoelectronic device package 410 according to a fourth embodiment, the package 410 including ESD diodes 472, 474 disposed along a front surface 413 of a substrate 412, and an emitter diode 460 disposed within a reflector cavity 420 bounded in part by a membrane portion 415 of the substrate 412. The membrane portion 415 defines microvias 432, 434 disposed along the reflector cavity 420 but laterally separated from the emitter diode 460 and thermal contact pad 445 disposed therebeneath along the backside surface 414. In this regard, the thermal contact pad 445 is electrically isolated. The emitter diode 460 is disposed on a conductor layer 480, which optionally may comprise a die attach pad. Although not shown, an insulating layer (such as the layer 146 illustrated in FIG. 2) may coat most or all of the substrate surface prior to the formation of vias or other contacts to prevent electrical conduction as need.

The emitter diode 460 is protected against electrostatic discharge or voltage aberration by the ESD diodes 472, 474, which are in electrical communication with conductive traces 456, 458 that extend up the walls of the reflector cavity 420. Such traces contact a conductive path through the emitter diode 460 including the microvias 432, 434, traces 452, 454, conductor layer 480, wirebond 467, and contact 466. The walls of the reflector cavity 420 may include reflective material in addition to the traces 456, 458; alternatively, the traces 456, 458 may be reflective and extend substantially around the reflector cavity 420 to serve as the reflective surface.

Deposited over the diode 460 are an encapsulant material 424, a phosphor layer 461, and a lens 425. The package 410 preferably has an overall height dimension (H) of less than or equal to about 300 microns, and a width dimension (W) of less than or equal to about 1800 microns.

Figure 4B:
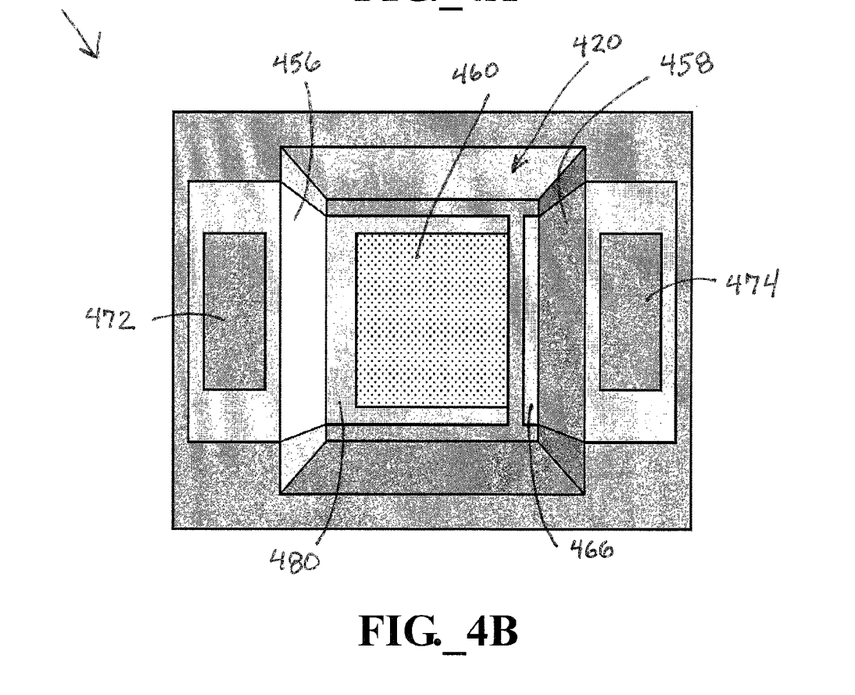
FIG. 4B is a top plan schematic view of a central portion of the microscale optoelectronic device package portion of FIG. 4A, depicting the ESD diodes disposed along the front surface of the substrate along opposite edges of the reflector cavity.

FIG. 4B illustrates a top plan schematic view of a portion of the device package 410 of FIG. 4A, with the wirebond 467, encapsulant 424, phosphor layer 461, and lens 425 omitted for clarity.

Figure 5:
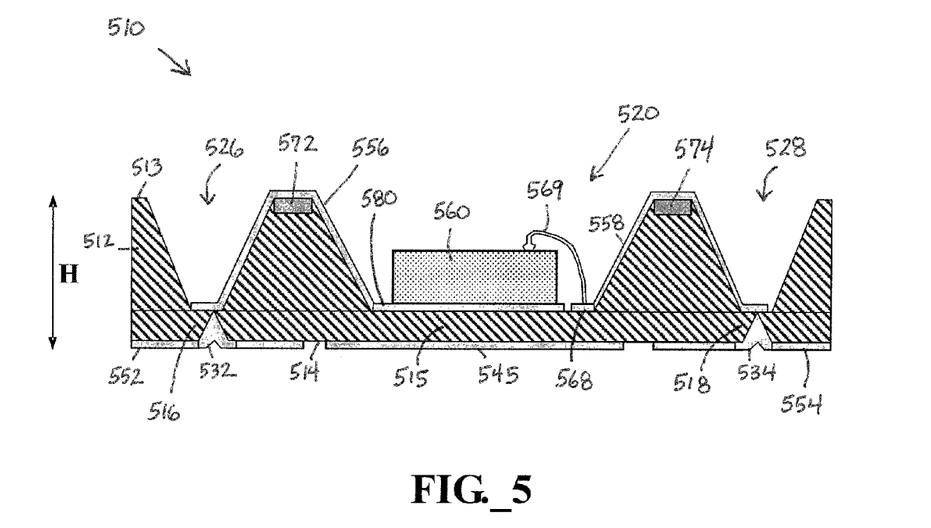
FIG. 5 is a cross-sectional schematic view of at least a portion of a microscale optoelectronic device package according to a fifth embodiment, the package including ESD diodes disposed along a front surface of a substrate, an emitter diode disposed within a reflector cavity bounded in part by a first membrane portion of the substrate, with the substrate defining additional cavities that are non-adjacent to the emitter diode and bounded by second membrane portions of the substrate that define microvias located remotely from the emitter diode.

FIG. 5 illustrates at least a portion of a microscale optoelectronic device package 510 according to a fifth embodiment, the package 510 including ESD diodes 572, 574 disposed along a front surface 513 of a substrate 512, and an emitter diode 560 disposed within a reflector cavity 520 bounded in part by a first membrane portion 515 of the substrate 512. The substrate 512 also defines peripheral cavities 526, 528 that are non-adjacent to the emitter diode 560, and that bounded in part by second membrane portions 516, 518 of the substrate 512 that define microvias 532, 534 located remotely from the emitter diode 560. The peripheral cavities 526-528 may be substantially smaller than the reflector cavity 520, and/or have a substantially different shape. The emitter diode 560 is disposed on a conductor layer 580, which is disposed over an electrically isolated thermal contact pad 545

The emitter diode 560 is protected against electrostatic discharge or voltage aberration by the ESD diodes 572, 574, which are in electrical communication with conductive traces 556, 558 that extend up the walls of the reflector cavity 520, over the front surface 513 of the substrate 512, and down the walls of the peripheral cavities 526, 528 to contact microvias 532, 534. A resulting conductive path through emitter diode 560 includes traces 552, 554 formed on the backside surface 514, the microvias 532, 534, traces 556, 558, the conductive layer 580, wirebond 569, and contact 568.

The substrate may be formed of P-type silicon. The resulting package 510 preferably has an overall height dimension (H) of less than or equal to about 250 microns.

Figure 6:
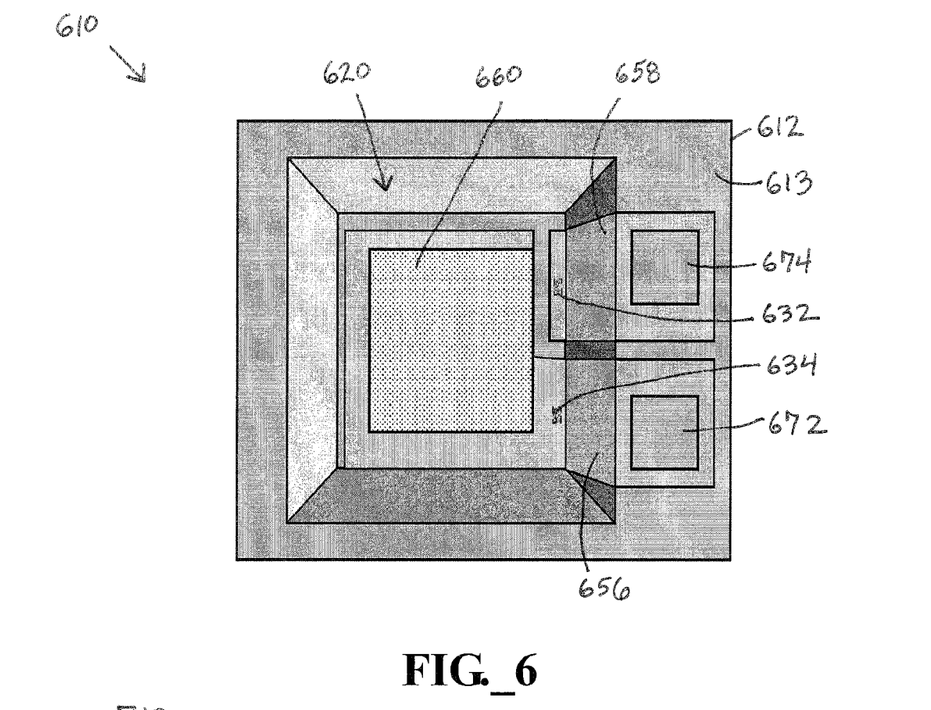
FIG. 6 is a top plan schematic view of at least a portion of a microscale optoelectronic device package according to a sixth embodiment, the package including an emitter diode disposed within a reflector cavity defined in a substrate, with ESD diodes disposed along a front surface of the substrate along the same edge of the reflector cavity.

FIG. 6 is a top plan schematic view of at least a portion of a microscale optoelectronic device package 610 according to a sixth embodiment, the package 610 including an emitter diode 660 disposed within a reflector cavity 620 defined in a substrate 612, with ESD diodes 672, 674 disposed along a front surface 613 of the substrate 612 along a common edge bordering the reflector cavity 620. Traces 656, 658 provide electrical communication with the ESD diodes 672, 674. Vias 632 and 634 (illustrated in phantom) may be provided and coupled with traces 656, 658, respectively, to provide electrical paths to the backside of the package 610. By disposing the ESD diodes 672, 674 and traces 656, 658 along a common edge, the overall size or top area of the device 610 may be kept to a minimum. While no wirebond between trace 658 and the upper surface of the emitter diode 660 is shown, it is to be understood such a wirebond may be provided.

Figure 7:
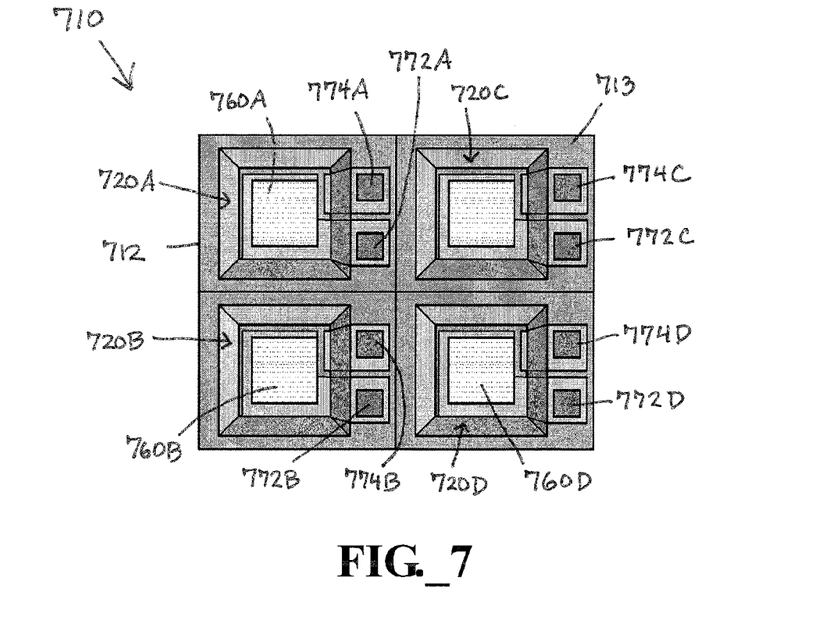
FIG. 7 is a top plan schematic view of at least a portion of a microscale optoelectronic device package according to a seventh embodiment, the package including a plurality of reflector cavities defined in a common substrate, an emitter diode disposed in each reflector cavity, and two ESD diodes disposed to one side along a front surface of the substrate for each emitter diode.

FIG. 7 is a top plan schematic view of at least a portion of a microscale optoelectronic device package 710 according to a seventh embodiment, the package 710 including a plurality of reflector cavities 720A-720D defined in a common substrate 712, with an emitter diode 760A-760D disposed in each reflector cavity 720A-720D, and two ESD diodes 772A-772D, 774A-774D disposed to one side along a front surface 713 of the substrate 712 for each emitter diode 760A-760D. In the resulting multi-reflector, multi-emitter package 710, each emitter diode 760A-760D is preferably independently controlled.

Figure 8:
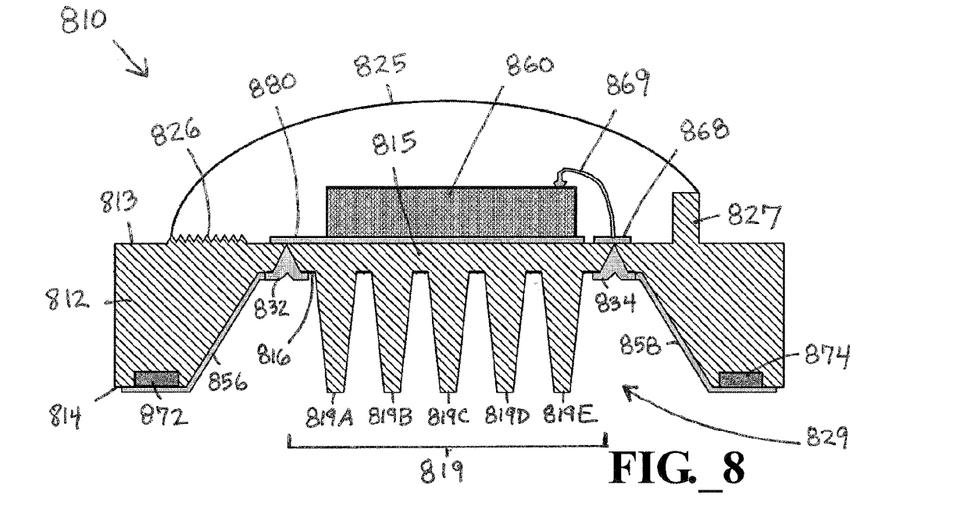
FIG. 8 is a cross-sectional schematic view of at least a portion of a microscale optoelectronic device package according to an eighth embodiment, the package including ESD diodes disposed along a backside surface of the substrate, with an emitter diode disposed along a front surface of the substrate over a membrane portion of the substrate bounding a backside cavity and defining microvias, with two retention elements defined along a front surface of the substrate to retain a material covering the emitter diode, and with an integrated heat spreader comprising a plurality of fins protruding into the backside cavity.

FIG. 8 is a cross-sectional schematic view of at least a portion of a microscale optoelectronic device package 810 according to an eighth embodiment, the package 810 including ESD diodes 872, 874 disposed along a backside surface 814 of the substrate 812, with an emitter diode 860 disposed along a front surface 813 of the substrate 812. The emitter diode 860 is disposed over a conductor layer 880 and a membrane portion 815 of the substrate 812 that bounds a backside cavity 829 in the substrate 812, with the membrane portion 815 defining microvias 832, 834. The backside cavity facilitates the formation of microvias while enabling the emitting diode to emit light in all directions without impacting reflector cavity walls. This reduces the overall size of the emitter, which may be beneficial for purpose of designing of secondary optics (such as a focusing lens, for example).

The emitter diode 860 is protected against electrostatic discharge or voltage aberration by the ESD diodes 872, 874, which are in electrical communication with conductive traces 856, 858 that extend up the walls of the backside cavity 829. Such traces 856, 858 are part of a conductive path through the emitter diode 860 including the microvias 832, 834, conductor layer 880, wirebond 869, and contact 868.

Multiple retention elements 826, 827 are defined along a front surface 813 of the substrate 812 to retain a material 825 (e.g., lens material) covering the emitter diode 860. A first retention element 826 is depicted as a locally roughened portion of the upper surface 813. A second retention element 827 is depicted as a post or pylon protruding upward from upper surface 813. Such retention elements 826, 826 provide sites for anchoring the covering material 825, which may form a lens over the emitter diode 860.

A plurality of fins 819A-819E extending from a lower surface 816 of the membrane portion 815 protrude into the backside cavity 829 to serve as an integral heat spreader 819. Such fins 819A-819E are desirably provided in close proximity to the emitter diode 860 and are formed of a thermally conductive material (e.g., silicon nitride) to conduct heat away from the emitter diode 860 in operation. The vias 832, 834 are preferably formed to the outside of the heat spreader 819. In one embodiment, the fins 819A-819E are formed by etching. Preferably, the fins 819A-819E and the backside cavity 829 are formed in a common set of manufacturing steps, with the heat spreader 819 comprising a continuously formed extension of the substrate. The fins 819A-819E may be provided with a length shorter than, substantially equal to, or greater than the depth of the backside cavity 829. In operation of the package 810, a flow of fluid (e.g., a liquid or gas, such as air) may be directed over or past the fins 819A-819E if desired to further enhance thermal exchange, thus allowing the emitter diode to operate at higher current levels without overheating.

Figure 9:
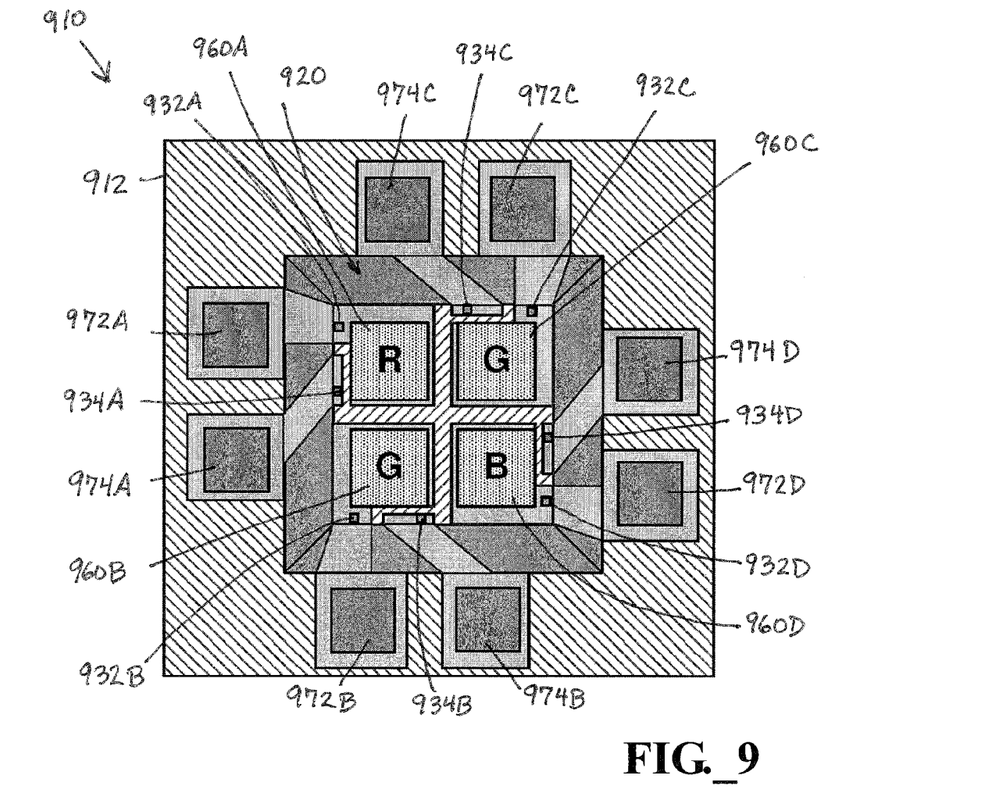
FIG. 9 is a top plan schematic view of at least a portion of a microscale optoelectronic device package according to a ninth embodiment, the package including four emitter diodes disposed in common reflector cavity, with each emitter diode having two associated ESD diodes disposed adjacent to one another along a different side of the reflector cavity.

FIG. 9 is a top plan schematic view of at least a portion of a microscale optoelectronic device package 910 according to a ninth embodiment, the package 910 including four emitter diodes 960A-960D disposed in common reflector cavity 920 defined in a substrate 912, with each emitter diode 960A-960D having two associated ESD diodes 972A-972D, 974A-974D disposed adjacent to one another along a different side of the reflector cavity 920. Vias 932A-932D and 934A-932D may be provided to provide electrical paths to the backside of the package 910. The four emitter diodes 960A-960D may desirably include one red light emitting diode 960A, two green light emitting diodes 960B-960C, and one blue light emitting diode 960D, which in combination emit light perceived as white; however, any number and type (including wavelength) of emitter diode may disposed in the cavity 920. Each emitter diode 960A-960D is separated from an adjacent diode by a distance of preferably less than about 200 microns; more preferably less than about 100 microns, and still more preferably less than about 50 microns. The resulting structure closely approximates a point source as the spacing between adjacent dies of different colors may be nearly or completely imperceptible to the human eye when the package 910 is in operation. The package 10 preferably has an overall height dimension (H) of less than or equal to about 250 microns, and a width dimension (W) of preferably less than or equal to about 4 millimeters; more preferably less than or equal to about 3 millimeters. In a further embodiment, ESD diodes may be connected to more than one emitter, thus reducing the number of diodes required to provide ESD protection for a resulting device. In a further embodiment, a plurality of packages 910 may be replicated on a common substrate.

Figure 10:
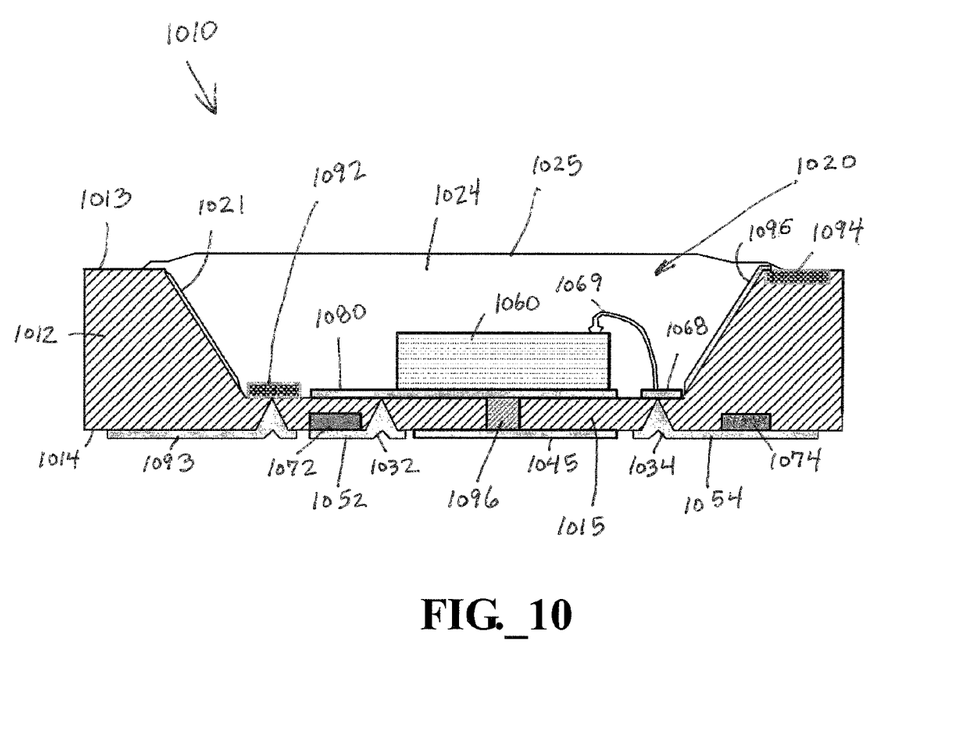
FIG. 10 is a cross-sectional schematic view of at least a portion of a microscale optoelectronic device package according to a tenth embodiment, the package including ESD diodes disposed along a backside surface of the substrate, and an emitter diode disposed in a reflector cavity bounded in part by a membrane portion of the substrate, the package further including a first radiation sensor in the reflector cavity, a second radiation sensor disposed along the front surface of the substrate, and a thermal sensor extending through the membrane and disposed in thermal communication with the emitter diode.

FIG. 10 is a cross-sectional schematic view of at least a portion of a microscale optoelectronic device package 1010 according to a tenth embodiment, the package including ESD diodes 1072, 1074 disposed along a backside surface 1014 of the substrate 1012, and an emitter diode 1060 disposed in a reflector cavity 1020. The reflector cavity 1020 is bounded in part by a membrane portion 1015 of the substrate 1012 defining two microvias 1032, 1034 that are laterally separated from the emitter diode 1060 and thermal contact pad 1045. The emitter portion 1060 is disposed over a conductor layer 1080, which is disposed over the electrically isolated thermal contact pad 1045.

The emitter diode 1060 is protected against electrostatic discharge or voltage aberration by the ESD diodes 1072, 1074, which are in electrical communication with conductive traces 1052, 1054 that are part of a conductive path through the emitter diode 1060 including the microvias 1032, 1034, conductor layer 1080, wirebond 1069, and contact 1068.

As illustrated, the package 1010 includes a first radiation sensor 1092, such as a photodiode, on a portion of the substrate 1012 adjacent to the conductor layer 1080. The radiation sensor 1092 may be formed in situ, or may be formed in the substrate 1012 prior to definition of the cavity 1020. Conductive traces 1093 and vias are preferably provided along the back surface 1014 to permit electrical communication with the radiation sensor 1092 (for clarity only one trace is shown in the figure) independent of electrical communication with the emitter diode 1060. An encapsulant material 1024 may substantially fill the reflector cavity 1020 and cover at least a portion of the sensor 1092. Radiation from the emitter diode 1060 may or may not impinge directly on the radiation sensor 1092, but at least a portion of the light will reflect onto it due to Fresnel reflection from the encapsulant surface 1025. So positioned in the reflector cavity 1020 (which may include reflective material along the sidewall thereof), the radiation sensor 1092 may be used to sense radiation emanating from the emitter diode 1060; alternatively, such sensor 1092 may be used to sense motion of an adjacent body, or radiation emanating from another (e.g., ambient) source. Although illustrated as mounted on the substrate 1012 adjacent to the conductor pad 1080, it is to be appreciated that the sensor 1092 may be mounted in any appropriate location on or around the reflector cavity, including on various elements that may protrude into or above such cavity.

The package 1010 further includes a second radiation sensor 1094 disposed along the front surface 1013 of the substrate 1012. Such sensor 1094 may be used, for example, to sense motion of an adjacent body, or radiation emanating from another (e.g., ambient) source. The sensor 1094 may be fully or partially embedded or recessed in the front surface 1013 if desired. A conductive trace 1096 may be provided in electrical communication with the sensor 1094.

The package 1010 further includes a thermal sensor 1096 sensor that is preferably disposed in thermal communication with the emitter diode 1060. Such thermal sensor 1096 may comprise a thin-film resistor disposed adjacent to or below the emitter diode 1060. The thermal sensor 1096 and/or a conductive trace extending therefrom preferably extends through the membrane 1015 to enable transmission of a sensor output signal to, e.g., a control element communicatively coupled with the emitter diode 1060 (or, alternatively, to the emitter diode 1060 itself). In one embodiment, the thermal sensor 1096 contacts the conductor layer 1080, or the emitter diode directly. For ease of fabrication, however, the thermal sensor 1096 may not be in direct contact with the emitter diode 1060, so long as it remains in thermal communication therewith. For example, the thermal sensor 1096 may contact the thermal contact pad 1045 disposed under the emitter diode 1060.

Various devices incorporating optoelectronic device articles and packages may be formed according to further embodiments of the invention. Certain embodiments provide an optoelectronic device or an illumination device including at least one optoelectronic device article as disclosed herein. In a preferred embodiment, an illumination device outputs visible light having a color rendering index value of preferably greater than about 80, more preferably greater than about 90. In one embodiment, a color mixing illumination device adapted to sequentially output a plurality of different wavelengths includes at least one optoelectronic device article as disclosed herein. In still another embodiment, a display device adapted to display images and/or text includes at least one optoelectronic device article as disclosed herein.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. An optoelectronic device article comprising:
   a substrate containing at least one electrically conductive via;
   at least one emitter diode adapted to emit radiation and disposed in or on the substrate;
   at least one ESD diode disposed in or on the substrate; and
   a first electrically conductive path between the at least one emitter diode and the at least one via, the path being in electrical communication with the at least one ESD diode;
   wherein the at least one emitter diode comprises a plurality of emitter diodes; wherein the substrate comprises a N-type layer, a P-type layer, and a sinker implant element penetrating a junction between the N-type layer and the P-type layer; and
   wherein the optoelectronic device article includes a diced edge, the sinker implant element is exposed along the diced edge, and the sinker implant element is adapted to isolate the junction from dicing damage.

2. The optoelectronic device article of claim 1, wherein the plurality of emitter diodes comprises at least one laser diode.

3. The optoelectronic device article of claim 1, wherein the plurality of emitter diodes comprises at least one LED.

4. The optoelectronic device article of claim 1, wherein the substrate defines a reflector cavity, and the plurality of emitter diodes is disposed substantially within the reflector cavity.

5. The optoelectronic device article of claim 1, wherein each emitter diode of the plurality of emitter diodes is independently controlled.

6. The optoelectronic device article of claim 1, wherein the plurality of emitter diodes includes emitter diodes adapted to emit peak wavelengths that differ from one another.

7. The optoelectronic device article of claim 1, comprising an electrical driver circuit fabricated in or on the substrate.

8. The optoelectronic device article of claim 1, comprising an electrically isolated thermal contact pad in thermal communication with the at least one emitter diode.

9. The optoelectronic device article of claim 1, wherein the at least one ESD diode is substantially embedded in the substrate.

10. The optoelectronic device article of claim 1, wherein the substrate has a front surface along which radiation is transmitted outward from the at least one emitter diode, wherein the at least one ESD diode is disposed in or on the substrate adjacent to the front surface.

11. The optoelectronic device article of claim 1, wherein the substrate has a back surface, and the at least one ESD diode is disposed in or on the substrate adjacent to the back surface.

12. The optoelectronic device article of claim 1, wherein the substrate defines a reflector cavity, and the plurality of emitter diodes is disposed substantially within the reflector cavity.

13. The optoelectronic device article of claim 12, wherein the reflector cavity extends downward from a front surface of the substrate, has at least one sidewall, and is bounded from below by a reduced-thickness membrane portion of the substrate, and the optoelectronic device article further comprises an electrical trace extending from the membrane portion up the at least one sidewall to the front surface.

14. The optoelectronic device article of claim 12, wherein the reflector cavity has any of a depth of less than about 250 microns and a width of less than about 2 millimeters.

15. The optoelectronic device article of claim 12, further comprising at least one electrically conductive contact disposed within the reflector cavity and at least one wirebond communicatively coupled between the at least one contact and the at least one via, wherein the at least one wirebond is coupled to an upper surface of the at least one emitter diode along which radiation is transmitted outward from the at least one emitter diode.

16. An optoelectronic device article comprising:
   a substrate containing at least one electrically conductive via;
   at least one emitter diode adapted to emit radiation and disposed in or on the substrate;
   at least one ESD diode disposed in or on the substrate;
   a first electrically conductive path between the at least one emitter diode and the at least one via, the path being in electrical communication with the at least one ESD diode;
   any of an encapsulant and a lens disposed over the at least one emitter diode and secured to a portion of the substrate comprising an integrated retention element, wherein the retention element comprises (i) a roughened surface of the substrate comprising a plurality of ridges adapted to retain any of an encapsulant and a lens material, and (ii) a raised post protruding from the substrate into any of any encapsulant and a lens material, wherein the raised post extends to a height above the plurality of ridges.

17. The optoelectronic device article of claim 1, wherein:
   the substrate has an upper surface and a lower surface, with a backside cavity defined in the lower surface; and
   the plurality of emitter diodes is disposed along the upper surface.

18. An optoelectronic device article comprising:
   a substrate containing at least one electrically conductive via, the substrate comprising an upper surface and a lower surface with a backside cavity defined in the lower surface, wherein the backside cavity is bounded along portions thereof by a reduced thickness membrane portion of the substrate and lateral cavity walls defined in the substrate;

at least one emitter diode adapted to emit radiation, disposed in or on the substrate, and arranged to emit light in a direction extending outward from the upper surface;
at least one ESD diode disposed in or on the substrate;
a first electrically conductive path between the at least one emitter diode and the at least one via, the path being in electrical communication with the at least one ESD diode;
an integrated heat spreader comprising a plurality of fins protruding into the backside cavity;
wherein at least one circuit element in electrical communication with the at least one emitter diode is arranged in or on at least one lateral cavity wall; and
wherein each lateral cavity wall is substantially wider than each fin of the plurality of fins.

19. The optoelectronic device article of claim 1, wherein the substrate comprises a first reduced-thickness membrane portion having a thickness of less than or equal to about 20 μm and arranged to support the at least one emitter diode, wherein any via of the at least one via is defined in the first membrane portion.

20. The optoelectronic device article of claim 1, wherein the at least one via comprises a microvia having a narrowest lateral dimension of less than or equal to about 50 μm.

21. The optoelectronic device article of claim 1, further comprising a phosphor material layer deposited on or over the at least one emitter diode.

22. The optoelectronic device article of claim 1, further comprising at least one thermal sensing element in thermal communication with the at least one emitter diode.

23. The optoelectronic device article of claim 22, wherein the at least one thermal sensing element comprises a thin-film resistor.

24. The optoelectronic device article of claim 22, wherein the at least one thermal sensing element provides a thermal sensing element output signal, and the article further comprises a control element adapted to control any of voltage and current supplied to the at least one emitter diode responsive to the thermal sensing element output signal.

25. The optoelectronic device article of claim 22, wherein the at least one thermal sensing element comprises a plurality of thermal sensing elements.

26. The optoelectronic device article of claim 1, further comprising at least one radiation sensing element adapted to provide a radiation sensing element output signal.

27. The optoelectronic device article of claim 26, further comprising a control element adapted to activate the at least one emitter diode responsive to the radiation sensing element output signal.

28. The optoelectronic device article of claim 26, further comprising a control element adapted to control any of voltage and current supplied to the at least one emitter diode responsive to the radiation sensing element output signal.

29. The optoelectronic device article of claim 1, having a thermal resistance of less than about 3 K/W between the at least one emitter diode and a heat dissipating structure.

30. The optoelectronic device article of claim 1, further comprising at least one die attach pad disposed between the substrate and the at least one emitter diode.

31. The optoelectronic device article of claim 1, wherein the at least one emitter diode comprises plurality of emitter diodes, and the plurality of emitter diodes is arranged with a spatial density of at least about 20 square millimeters of emitter diodes per cm$^2$.

32. The optoelectronic device article of claim 31, wherein the plurality of emitter diodes is arranged with a spatial density of at least about 60 square millimeters of emitter diodes per cm$^2$.

33. The optoelectronic device article of claim 31, wherein the plurality of emitter diodes is arranged with a spatial density of at least about 80 square millimeters of emitter diodes per cm$^2$.

34. The optoelectronic device article of claim 1, being devoid of any laser diode, and having an average flux density of at least about 250 mW/mm$^2$ per watt of input power, as measured at an upper surface of the device article.

35. The optoelectronic device article of claim 1, being devoid of any laser diode, and having an average flux density of at least about 500 mW/mm$^2$ per watt of input power, as measured at an upper surface of the device article.

36. The optoelectronic device article of claim 1, being devoid of any laser diode, and having an average flux density of at least about 800 mW/mm$^2$ per watt of input power, as measured at an upper surface of the device article.

37. The optoelectronic device article of claim 1, wherein the at least one emitter diode comprises at least one hundred emitter diodes.

38. The optoelectronic device article of claim 1, wherein the at least one emitter diode comprises at least one thousand emitter diodes.

39. The optoelectronic device article of claim 1, wherein the at least one ESD diode comprises two ESD diodes corresponding to an emitter diode of the at least one emitter diode.

40. The optoelectronic device article of claim 1, wherein at least one emitter diode of the plurality of emitter diodes has a top surface area of less than or equal to about 1 mm$^2$.

41. The optoelectronic device article of claim 1, further comprising at least one thermally conductive fin protruding from a portion of the substrate and adapted to dissipate heat emanating from the at least one emitter diode.

42. An optoelectronic device comprising the optoelectronic device article of claim 1.

43. The optoelectronic device article of claim 1, arranged to output light having a color rendering index value of greater than about 80.

44. The optoelectronic device article of claim 1, arranged to output light having a color rendering index value of greater than about 90.

45. The optoelectronic device article of claim 1, wherein the at least one emitter diode comprises a plurality of LED dies including LED dies adapted to emit peak wavelengths that differ from one another, wherein each LED die of the plurality of LED dies is independently controlled.

46. A color mixing illumination device adapted to sequentially output a plurality of different wavelengths, the device comprising an optoelectronic device article according to claim 1, wherein the plurality of LED dies includes LED dies adapted to emit peak wavelengths that differ from one another, and wherein each LED die of the plurality of LED dies is independently controlled.

47. A display device adapted to display any of images and text, the display device comprising an optoelectronic device article according to claim 1, wherein: the plurality of LED dies includes LED dies adapted to emit peak wavelengths that differ from one another, and wherein each LED die of the plurality of LED dies is independently controlled.

48. The optoelectronic device article of claim 18, wherein the optoelectronic device article comprises at least one of the following features (a) and (b):
(a) the at least one LED comprises a plurality of LEDs of different colors; and (b) the at least one via comprises a microvia having a narrowest lateral dimension of less than or equal to about 50 μm.

49. The optoelectronic device article of claim 18, having a flux density of at least about 500 mW/mm² per watt of input power, as measured at an upper surface of the device article.

50. The optoelectronic device article of claim 18, having a flux density of at least about 800 mW/mm² per watt of input power, as measured at an upper surface of the device article.

51. The optoelectronic device article of claim 18, wherein the plurality of emitter diodes is arranged with a spatial density of at least about 20 square millimeters of emitter diodes per cm².

52. The optoelectronic device article of claim 51, wherein the plurality of emitter diodes is arranged with a spatial density of at least about 60 square millimeters of emitter diodes per cm².

53. The optoelectronic device article of claim 51, wherein the plurality of emitter diodes is arranged with a spatial density of at least about 80 square millimeters of emitter diodes per cm².

54. The optoelectronic device article of claim 18, further comprising an electrically isolated thermal contact pad in thermal communication with the at least one emitter diode.

55. The optoelectronic device article of claim 54, having a thermal resistance of less than about 3 K/W between the at least one emitter diode and a heat dissipating structure.

56. The optoelectronic device of claim 18, wherein the plurality of fins is embodied as continuously formed protruding extensions of the substrate, and is adapted to dissipate heat emanating from the at least one emitter diode.

57. The optoelectronic device article of claim 18, further comprising: at least one thermal sensing element in thermal communication with the at least one emitter diode, wherein the at least one thermal sensing element is adapted to generate an output signal indicative of temperature of the at least one emitter diode.

58. The optoelectronic device article of claim 57, wherein the at least one thermal sensing element comprises a thin-film resistor.

59. The optoelectronic device article of claim 57, wherein the at least one thermal sensing element provides a thermal sensing element output signal, and the optoelectronic device article further comprises a control element adapted to control any of voltage and current supplied to the at least one emitter diode responsive to the thermal sensing element output signal.

60. The optoelectronic device article of claim 57, wherein the at least one thermal sensing element comprises a plurality of thermal sensing elements.

61. The optoelectronic device article of claim 18, further comprising: at least one radiation sensing element adapted to provide a radiation sensing element output signal to any of (A) the at least one emitter diode and (B) a control element associated with the at least one emitter diode.

62. The optoelectronic device article of claim 61, further comprising a control element adapted perform any of the following responsive to the radiation sensing element output signal: (A) activate the at least one emitter diode; (B) control voltage supplied to the emitter diode; and (C) control current supplied to the emitter diode.

63. The optoelectronic device article of claim 61, wherein the at least one radiation sensing element is adapted to sense any of ambient light intensity, presence of ambient light, and motion of a body proximate to the optoelectronic device article.

64. The optoelectronic device article of claim 61, wherein the radiation sensing element is adapted to sense any of intensity, color, wavelength, and frequency output of the optoelectronic device article.

65. The optoelectronic device article of claim 18, wherein the at least one LED is arranged to output white light.

66. The optoelectronic device article of claim 18, wherein the at least one LED comprises a plurality of LEDs of different colors.

67. The optoelectronic device article of claim 18, further comprising at least one phosphor arranged to convert one or more wavelengths of at least a portion of radiation emanating from the at least one LED to one or more different wavelengths.

68. The optoelectronic device article of claim 48, wherein the at least one via comprises a microvia having a narrowest lateral dimension of less than or equal to about 50 μm.

69. The optoelectronic device article of claim 18, wherein each fin of the plurality of fins has a height that is less than or equal to the depth of the backside cavity.

70. The optoelectronic device article of claim 26, wherein the at least one radiation sensing element is adapted to sense motion of a body proximate to the optoelectronic device article and is adapted to provide a radiation sensing element output signal, and wherein the radiation sensing element output signal is used to affect operation of the at least one emitter diode.

71. The optoelectronic device article of claim 1, wherein the at least one emitter diode comprises a plurality of emitter diodes, each emitter diode of the plurality of emitter diodes has an emitter diode width, and each emitter diode of the plurality of emitter diodes has a center-to-center spacing relative to an adjacent emitter diode of no more than about 110% of the emitter diode width.

72. The optoelectronic device article of claim 16, wherein the at least one emitter diode comprises a plurality of emitter diodes, each emitter diode of the plurality of emitter diodes has an emitter diode width, and each emitter diode of the plurality of emitter diodes has a center-to-center spacing relative to an adjacent emitter diode of no more than about 110% of the emitter diode width.

\* \* \* \* \*